United States Patent
Wang et al.

(10) Patent No.: US 9,136,123 B2
(45) Date of Patent: Sep. 15, 2015

(54) HARDMASK SURFACE TREATMENT

(71) Applicant: Rohm and Haas Electronics Materials LLC, Marlborough, MA (US)

(72) Inventors: Deyan Wang, Hudson, MA (US); Peter Trefonas, III, Medway, MA (US); Shintaro Yamada, Shrewsbury, MA (US); Kathleen M. O'Connell, Cumberland, RI (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 93 days.

(21) Appl. No.: 13/745,753

(22) Filed: Jan. 19, 2013

(65) Prior Publication Data

US 2014/0206201 A1     Jul. 24, 2014

(51) Int. Cl.
*H01L 21/033*   (2006.01)
*C08L 33/06*   (2006.01)
*C08K 5/56*   (2006.01)
*G03F 1/00*   (2012.01)
*C08K 5/00*   (2006.01)

(52) U.S. Cl.
CPC .......... *H01L 21/0332* (2013.01); *C08K 5/0091* (2013.01); *C08K 5/56* (2013.01); *C08L 33/064* (2013.01); *C08L 33/066* (2013.01); *G03F 1/00* (2013.01)

(58) Field of Classification Search
None
See application file for complete search history.

(56) References Cited

U.S. PATENT DOCUMENTS

| | | | |
|---|---|---|---|
| 6,136,501 A | 10/2000 | Trefonas et al. | |
| 6,303,270 B1 | 10/2001 | Flaim et al. | |
| 6,740,469 B2 | 5/2004 | Krishnamurthy et al. | |
| 7,364,832 B2 | 4/2008 | Sun et al. | |
| 7,457,507 B2 | 11/2008 | Kuramoto et al. | |
| 7,968,268 B2 | 6/2011 | Wang | |
| 8,795,774 B2 | 8/2014 | Wang et al. | |
| 8,927,439 B1 | 1/2015 | Wang et al. | |
| 2004/0171743 A1* | 9/2004 | Flaim et al. | 524/577 |
| 2010/0280148 A1* | 11/2010 | Webster et al. | 523/122 |
| 2012/0223418 A1 | 9/2012 | Stowers et al. | |
| 2013/0337179 A1 | 12/2013 | Wang et al. | |
| 2014/0202632 A1 | 7/2014 | Wang et al. | |
| 2015/0024522 A1 | 1/2015 | Wang et al. | |

OTHER PUBLICATIONS

Taiwanese Search Report for corresponding Taiwan Application No. 103101938, dated Apr. 1, 2015.

* cited by examiner

*Primary Examiner* — Satya Sastri

(57) ABSTRACT

Compositions suitable for forming oxymetal hardmask layers are provided. Methods of forming oxymetal hardmask layers using such compositions are also provided, where the surface of the oxymetal hardmask layer formed has a water contact angle substantially matched to that of subsequently applied organic coatings.

16 Claims, No Drawings

HARDMASK SURFACE TREATMENT

The present invention relates generally to the field of semiconductor manufacture, and more particularly to the field of hardmasks used in the manufacture of semiconductors.

With the continuous decrease in both critical dimension and pitch in 193 nm immersion lithography, the use of a hardmask in certain layers of integrated circuit fabrication has become increasingly popular, owing to the excellent etch selectivity of the hardmask materials. Certain metal hardmasks, such as titanium nitride, are applied by chemical vapor deposition (CVD), onto a processed wafer. Amorphous carbon hardmask, applied through either CVD or a spin-on technique, and silicon hardmask (or silicon antireflective coating or SiARC) are among the conventional technologies in integrated circuit fabrication. Spin-on, metal hardmask is now gaining attraction in the integrated circuit industry, in part due to potential cost reductions as compared to conventional approaches, as well as for simplification of fabrication processes.

Oxymetal hardmasks are generally characterized as films containing a majority of inorganic domains with $(\text{-M-O-})_n$ linkages (oxymetal domains), where M is a metal and n>1, and may also be composed of minor amounts of other elements, such as carbon. Other hardmasks, such as mixed domain hardmasks, contain both oxymetal domains and metal nitride domains. Such conventional hardmasks may contain one or more metals, such as Hf, Zr, Ti, W, Al, Ta and Mo. The etch resistance of oxymetal domain-containing hardmask films is dependent, in part, on the particular metal used as well as the level of $(\text{-M-O-})_n$ domains present, with an increased level of such domains providing greater etch resistance.

A cured oxymetal hardmask film often has a much higher surface energy (or lower water contact angle) than that of a subsequently applied organic layer, such as a photoresist. Such a mismatch of surface energy causes poor adhesion between the oxymetal hardmask layer and the subsequently applied organic layer. In the case of a subsequently applied photoresist layer, such mismatch in surface energy results in severe pattern collapse.

Surface treatments are known in semiconductor manufacture. For example, silicon or silicon oxide surfaces are often treated with hexamethyldisilazane (HMDS) to improve adhesion to an organic layer coated on them. However, treatment of an oxymetal hardmask with HMDS does not work effectively to prevent pattern collapse in subsequently applied photoresists. Accordingly, there remains a need for an effective surface treatment for oxymetal hardmasks that reduces the water contact angle mismatch between the oxymetal hardmask and a subsequently applied organic layer, such as a photoresist. These needs and others have been met by the following invention.

The present invention provides a composition comprising: an organo-metal compound; a surface treating agent having a surface energy of 20 to 40 erg/cm$^2$ and comprising a surface treating moiety chosen from hydroxyl, protected hydroxyl, protected carboxyl, and mixtures thereof; and a solvent.

Also provided by the present invention is a method for forming an oxymetal hardmask comprising: providing a substrate; coating a film of the composition described above on a surface of the substrate; causing the surface treating agent to migrate to the surface of the film; and curing the film to form an oxymetal hardmask layer. Such process provides metal hardmask layers having a surface with an increased water contact angle as compared to hardmask layers formed from conventional hardmask compositions. The oxymetal hardmask layer resulting from such process typically has a water contact angle of ≥55°, preferably from 55 to 70°, and more preferably from 60 to 70°. Further, it is preferred that such process is free of a separate step of treating the oxymetal hardmask surface with a surface treating composition.

Also provided by the present invention is an oxymetal hardmask layer disposed on an electronic device substrate, the hardmask layer comprising inorganic domains having $(\text{-M-O-})_n$ linkages, where M is a Group 3 to Group 14 metal and n>1, and having a surface having a water contact angle of ≥55°. Preferably, such oxymetal hardmask layer surface has a water contact angle of 55 to 70°, and more preferably from 60 to 70°.

Further, the present invention provides a method of forming a patterned oxymetal hardmask comprising: providing a substrate; coating a film of a composition comprising an organo-metal compound; a surface treating agent having a surface energy of 20 to 40 erg/cm$^2$ and comprising a surface treating moiety chosen from protected hydroxyl, protected carboxyl, and mixtures thereof; and a solvent on a surface of the substrate; causing the surface treating agent to migrate to the surface of the film; and curing the film to form an oxymetal hardmask layer having a patterned surface comprising regions of different surface energies.

As used throughout this specification, the following abbreviations shall have the following meanings, unless the context clearly indicates otherwise: ca.=approximately; °C.=degrees Celsius; g=grams; mg=milligrams; mmol=millimoles; L=liters; mL=milliliters; nm=nanometers; Å=angstroms; Et=ethyl; i-Pr=iso-propyl; n-Bu=n-butyl; t-Bu=tert-butyl; sec.=seconds; msec.=milliseconds; min=minutes; and rpm=revolutions per minute. All amounts are percent by weight (wt %) and all ratios are molar ratios, unless otherwise noted. All numerical ranges are inclusive and combinable in any order, except where it is clear that such numerical ranges are constrained to add up to 100%.

As used herein, "oxymetal hardmask" refers to any metal hardmask comprising $(\text{-M-O-})_n$ domains, where M is a metal and n is an integer >1, and includes both oxymetal hardmasks having a majority of $(\text{-M-O-})_n$ domains and mixed domain hardmasks having both metal nitride domains and $(\text{-M-O-})_n$ domains. Oxymetal hardmasks may optionally include one or more other elements such as carbon, which are preferably present in a relatively minor amount as compared to the $(\text{-M-O-})_n$ domains. "Domain", as used herein, means a compact crystalline, semi-crystalline, or amorphous region formed by corresponding blocks of certain linkages, such as $(\text{-M-O-})_n$ linkages. The term "copolymer" refers to a polymer of 2 or more different monomers. "(Meth)acrylate" refers to both acrylate and methacrylate, and "(meth)acrylic" refers to both acrylic and methacrylic. As used herein, the term "pendant group" refers to a group attached to, but does not form a part of, the polymer backbone. The term "oligomer" refers to dimers, trimers, tetramers and other relatively low molecular weight materials that may be further cured. The term "polymer" includes the term "oligomer." "Branched" polymers include star polymers and dendritic polymers. "Alkyl" refers to linear, branched and cyclic alkyl. The articles "a" and "an" refer to the singular and the plural.

Compositions of the invention used to form oxymetal hardmask layers comprise an organo-metal compound; a surface treating agent having a surface energy of 20 to 40 erg/cm$^2$ and comprising a surface treating moiety chosen from hydroxyl, protected hydroxyl, protected carboxyl, and mixtures thereof; and a solvent. Any organo-metal compound suitable for forming oxymetal hardmask layers may be used in the present compositions. Such organo-metal compounds are film-forming and are typically polymeric (such as oligomeric), but may also be non-polymeric. The organo-metal compounds may contain a single metal, or may contain two or more different metals. That is, a single organo-metal compound, such as an oligomer, may have only one metal species, or may contain 2 or more different metal species. Alternatively, a mixture of organo-metal compounds, each having a single metal species, may be employed in order to deposit a mixed metal film. It is preferred that an organo-metal compound contain one or more atoms of a single metal species, and not species of different metals. Suitable metals useful in the present organo-metal compounds are any metal in Groups 3-14 of the periodic table. Preferably, the metal is chosen from Groups 4, 5, 6 and 13, and more preferably from Groups 4, 5 and 6. Preferred metals include titanium, zirconium, hafnium, tungsten, tantalum, molybdenum, and aluminum, and more preferably titanium, zirconium, hafnium, tungsten, tantalum, and molybdenum.

One suitable class of organo-metal compounds for use in the present compositions is a metal-oxygen oligomer of formula (1)

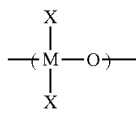
(1)

where each X is independently selected from light attenuating moieties, diketones, $C_{2-20}$polyols and $C_{1-20}$alkoxides; and M is a Group 3 to Group 14 metal. Preferred X substituents are diketones and $C_{1-20}$alkoxides, and more preferably diketones and $C_{1-10}$alkoxides. In one embodiment it is preferred that at least one X is a diketone of the structure

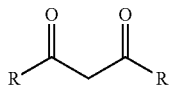

where each R is independently chosen from: hydrogen; $C_{1-12}$alkyl, $C_{6-20}$aryl, $C_{1-12}$alkoxy, and $C_{6-10}$phenoxy, and more preferably both X substituents are diketones. More preferably, each R is independently chosen from $C_{1-10}$alkyl, $C_{6-20}$aryl, $C_{1-10}$alkoxy, and $C_{6-10}$-phenoxy. Exemplary groups for R include methyl, ethyl, propyl, butyl, pentyl, hexyl, benzyl, phenethyl, naphthyl; phenoxy, methylphenoxy, dimethylphenoxy, ethylphenoxy and phenyloxy-methyl. A preferred structure of the metal-oxygen oligomer has formula (1a)

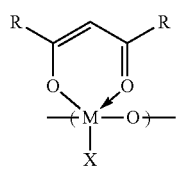
(1a)

where M, X and R are as described above. Such metal-oxygen oligomers are disclosed in U.S. Pat. No. 7,364,832. Similar metal-oxygen oligomers which are also useful in the present invention are found in U.S. Pat. Nos. 6,303,270; 6,740,469; and 7,457,507, and in U.S. Pat. App. Pub. No. 2012/0223418.

Another suitable class of organo-metal compounds useful in the present compositions is an oligomer comprising metal-containing pendant groups. Any film-forming organo-metal oligomer comprising one or more metal-containing pendant groups may be suitably used in the present compositions. Preferably, the organo-metal oligomer comprising one or more metal-containing pendant groups comprises, as polymerized units, one or more (meth)acrylate monomers, and more preferably one or more metal-containing (meth)acrylate monomers. Even more preferably, the organo-metal oligomer comprising one or more metal-containing pendant groups comprises as polymerized units one or more monomers of formula (2)

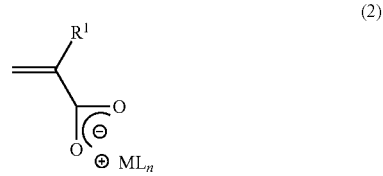
(2)

where $R^1$=H or $CH_3$; M=a Group 3 to Group 14 metal; L is a ligand; and n refers to the number of ligands and is an integer from 1-4. Preferably, M is a metal chosen from Groups 4, 5, 6 and 13, and more preferably from Group 4, 5 and 6. It is preferred that M=titanium, zirconium, hafnium, tungsten, tantalum, molybdenum, and aluminum, more preferably titanium, zirconium, hafnium, tungsten, tantalum, and molybdenum, and still more preferably zirconium, hafnium, tungsten, and tantalum.

The ligands, L, in formula (2) may be any suitable ligand, provided that such ligands can be cleaved during the curing step to form the metal oxide containing hardmask. Preferably, the ligand comprises an oxygen or sulfur atom bound to, coordinated to, or otherwise interacting with the metal. Exemplary classes of ligands are those containing one or more of the following groups: alcohols, thiols, ketones, thiones, and imines, and preferably alcohols, thiols, ketones, and thiones. Preferably, L is chosen from one or more of $C_{1-6}$alkoxy, beta-diketonates, beta-hydroxyketonates, beta-ketoesters, beta-diketiminates, amindinates, guanidinates, and beta-hydroxyimines. It is more preferred that L is chosen from one or more of $C_{1-6}$alkoxy, beta-diketonates, beta-hydroxyketones, and beta-ketoesters, and yet more preferably L is chosen from $C_{1-6}$alkoxy. The number of ligands is referred to in formula (2) by "n", which is an integer from 1-4, preferably from 2-4, and more preferably from 3-4. Preferred monomers of formula (2) are $Zr(C_{1-4}alkoxy)_3$ acrylate, $Zr(C_{1-4}alkoxy)_3$ methacrylate, $Hf(C_{1-4}alkoxy)_3$ acrylate, $Hf(C_{1-4}alkoxy)_3$ methacrylate, $Ti(C_{1-4}alkoxy)_3$ acrylate, $Ti(C_{1-4}alkoxy)_3$ methacrylate, $Ta(C_{1-4}alkoxy)_4$ acrylate, $Ta(C_{1-4}alkoxy)_4$ methacrylate, $Mo(C_{1-4}alkoxy)_4$ acrylate, $Mo(C_{1-4}alkoxy)_4$ methacrylate, $W(C_{1-4}alkoxy)_4$ acrylate, and $W(C_{1-4}alkoxy)_4$ methacrylate. The organo-metal compounds of formula (2) can be prepared by a variety of methods, such as by reacting a metal tetraalkoxide with acrylic or methacrylic acid in a suitable solvent, such as acetone.

The organo-metal oligomer comprising one or more metal-containing pendant groups may be comprised of polymerized units of a single monomer (homopolymer) or polymerized units of a mixture of 2 or more monomers (copolymer). Suitable copolymers may be prepared by conventional methods by polymerizing one or more monomers comprising a metal-containing pendant group with one or more other monomers, such other monomers may optionally comprise a metal-containing pendant group. Preferably, the organo-metal oligomer comprising one or more metal-containing pendant groups is prepared by conventional free-radical polymerization of one or more metal-containing (meth)acrylate monomers with one or more other ethylenically unsaturated monomers. Suitable ethylenically unsaturated monomers include, without limitation, alkyl (meth)acrylate monomers, aryl (meth)acrylate monomers, hydroxyalkyl (meth)acrylate monomers, alkenyl (meth)acrylates, (meth)acrylic acid, and vinyl aromatic monomers such as styrene and substituted styrene monomers. Preferably, the ethylenically unsaturated monomers are chosen from $C_{1-12}$alkyl (meth)acrylate monomers and hydroxy($C_{1-12}$)alkyl (meth)acrylate monomers, and more preferably $C_{1-12}$alkyl (meth)acrylate monomers and hydroxy($C_{2-6}$)alkyl (meth)acrylate monomers. Preferred $C_{1-12}$alkyl (meth)acrylate monomers and hydroxy($C_{1-12}$) alkyl (meth)acrylate monomers are methyl (meth)acrylate, ethyl (meth)acrylate, n-butyl (meth)acrylate, tert-butyl (meth)acrylate, ethylhexyl (meth)acrylate, hydroxyethyl (meth)acrylate, 2-hydroxypropyl (meth)acrylate, 1-methyl-2-hydroxyethyl (meth)acrylate, and 2-hydroxybutyl (meth) acrylate. Such copolymers may be random, alternating or block copolymers. These organo-metal oligomers may be composed of, as polymerized units, 1, 2, 3, 4 or more ethylenically unsaturated monomers in addition to the monomer comprising the metal-containing pendant group, such as a metal-containing (meth)acrylate monomer.

A further class of organo-metal compounds suitable for use in the present compositions is a compound of formula (3)

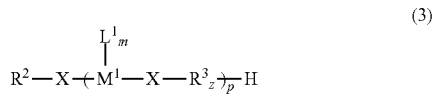
(3)

where $R^2 = C_{1-6}$alkyl; $M^1$ is a Group 3 to Group 14 metal; $R^3 = C_{2-6}$alkylene-X— or $C_{2-6}$alkylidene-X—; each X is independently chosen from O and S; z is an integer from 1-5; $L^1$ is a ligand; m refers to the number of ligands and is an integer from 1-4; and p=an integer from 2 to 25. It is preferred that $R^2$ is $C_{2-6}$alkyl, and more preferably $C_{2-4}$alkyl. Preferably, $M^1$ is a metal chosen from Groups 4, 5, 6 and 13, and more preferably from Groups 4, 5 and 6. It is preferred that $M^1$=titanium, zirconium, hafnium, tungsten, tantalum, molybdenum, and aluminum, more preferably titanium, zirconium, hafnium, tungsten, tantalum, and molybdenum, and still more preferably zirconium, hafnium, tungsten, and tantalum. X is preferably O. It is preferred that $R^3$ is chosen from $C_{2-4}$alkylene-X— and $C_{2-4}$alkylidene-X—, and more preferably from $C_{2-4}$alkylene-O— and $C_{2-4}$alkylidene-O—. Preferably, p=5-20, and more preferably 8-15. It is preferred that z=1-4, and more preferably z=1-3.

The ligands, $L^1$, in formula (3) may be any suitable ligand, provided that such ligands can be cleaved during the curing step to form the metal oxide containing hardmask. Preferably, the ligand comprises an oxygen or sulfur atom bound to, coordinated to, or otherwise interacting with the metal. Exemplary classes of ligands are those containing one or more of the following groups: alcohols, thiols, ketones, thiones, and imines, and preferably alcohols, thiols, ketones, and thiones. Preferably, $L^1$ is chosen from one or more of $C_{1-6}$alkoxy, beta-diketonates, beta-hydroxyketonates, beta-ketoesters, beta-diketiminates, amindinates, guanidinates, and beta-hydroxyimines. It is more preferred that $L^1$ is chosen from one or more of $C_{1-6}$alkoxy, beta-diketonates, beta-hydroxyketonates, and beta-ketoesters, and yet more preferably $L^1$ is chosen from beta-diketonates, beta-hydroxyketonates, and beta-ketoesters. The number of ligands is referred to in formula (3) by "m," which may be from 1-4, and preferably from 2-4. Preferred ligands for $L^1$ include: benzoylacetonate; pentane-2,4-dionate (acetoacetate); hexafluoroacetoacetate; 2,2,6,6-tetramethylheptane-3,5-dionate; and ethyl-3-oxobutanoate (ethylacetoacetate).

Oligomers of formula (3) may be prepared by conventional means known in the art such as by the following general equation:

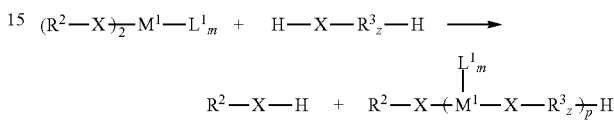

where $R^2$, $R^3$, X, $M^1$, $L^1$, m, p and z have the meanings described above for the oligomer of formula (3). The oligomers of formula (3) may contain a single metal species or a combination of different metal species each of which has similar plasma etch resistance, but preferably contain a single metal species. Typically, such reaction is performed at a temperature of ≤100° C., preferably ≤90° C., and more preferably ≤80° C.

A variety of non-polymeric organo-metal compounds may be used in the present compositions, provided that such compounds are capable of forming a film under the conditions used. Suitable non-polymeric organo-metal compounds include, without limitation, metal alkoxides, metal ketonates, and the like. Exemplary non-polymeric organo-metal compounds include, but are not limited to: hafnium tetraethoxide; hafnium tetrabutoxide; hafnium 2,4-pentanedionate; hafnium di-n-butoxide (bis-2,4-pentanedionate); hafnium 2-ethylhexoxide; hafnium tetramethylheptanedionate; hafnium trifluoropentanedionate; titanium allylacetoacetonate tris-iso-propoxide; tetrabutyltitanate; titanium di-n-butoxide (bis-2,4-pentanedionate); titanium di-iso-propoxide (bis-2,4-pentanedionate); titanium di-iso-propoxide (bis-tetramethylheptanedionate); titanium ethoxide; titanium iso-butoxide; titanium iso-propoxide; titanium n-propoxide; titanium methoxide; titanium n-nonyloxide; titanium tri-iso-propoxide tri-n-butyl stannoxide; tantalum (V) ethoxide; tantalum (V) methoxide; tantalum (V) tetraethoxide 2,4-pentanedionate; tungsten (V) ethoxide; tungsten (VI) ethoxide; zirconium n-butoxide; zirconium di-n-butoxide (bis-2,4-pentanedionate; zirconium di-iso-propoxide (bis-2,4-pentanedionate; zirconium ethoxide; zirconium iso-propoxide; zirconium n-propoxide; zirconium dimethacrylate di-n-butoxide; zirconium tetramethacrylate; zirconium 2-ethylhexoxide; zirconium hexafluoropentanedionate; zirconium 2-methyl-2-butoxide; zirconium tetra-2,4-pentanedionate; zirconium 2,2,6,6-tetramethyl-3,5-heptanedionate; and zirconium trifluoropentanedionate.

It will be appreciated by those skilled in the art that more than one organo-metal compound may be used in the present compositions. When combinations of organo-metal compounds are used, such compounds may be used in varying amounts, such as from 99:1 to 1:99 by weight, and preferably from 90:10 to 10:90 by weight. More preferably, the mixtures of organo-metal compounds are used in an amount from 80:20 to 20:80 by weight.

The present compositions also comprise a surface treating agent having a relatively low surface energy and comprising a surface treating moiety chosen from hydroxyl, protected hydroxyl, protected carboxyl, and mixtures thereof. In a preferred embodiment, the surface treating agent comprises a surface treating moiety chosen from protected hydroxyl, protected carboxyl, and mixtures thereof. While not intending to be bound by theory, it is believed that the surface treating moiety functions to anchor the surface treating agent to the oxymetal hardmask surface. A minimum of one surface treating moiety per surface treating agent molecule is required. There is no specific limit to the number of surface treating moieties per surface treatment agent molecule, as long as the surface energy of the surface treating agent has a relatively low surface energy. By "relatively low surface energy" is meant a (static) surface energy in the range of 20 to 40 erg/cm$^2$. Preferably, the surface treating agent has a surface energy in the range of 25 to 40 erg/cm$^2$, and more preferably 25 to 35 erg/cm$^2$. It will be appreciated by those skilled in the art that increasing the amount of surface treating moieties in the surface treating agent molecule typically increases the surface energy of the molecule. The surface treating agent in the composition is substantially free of un-protected carboxylic acid groups (that is, the surface treating agent comprises ≤0.5 mol % un-protected or "free" carboxylic acid groups).

Protected carboxyl groups are any group which is cleavable under certain conditions to yield a carboxyl group. Such protected carboxyl groups may be cleaved by heat, acid, base or a combination thereof, preferably by heat, acid or a combination thereof, and more preferably by heat. Exemplary protected carboxyl groups include esters, such as benzyl esters and esters having a quaternary carbon bonded directly to the alkoxy oxygen of the ester group. It is preferred that the protected carboxyl group is an ester having a quaternary carbon bonded directly to the alkoxy oxygen of the ester group, and more preferably the ester has the formula Y—C(O)—O—CR'R"R''', where Y is an organic residue, and each of R', R" and R''' are independently chosen from $C_{1-10}$alkyl. Preferred protected carboxyl groups include: tert-butyl esters; 1-alkyklcyclopentyl esters such as 1-methylcyclopentyl esters and 1-ethylcyclopentyl esters; 2,3-dimethyl-2-butyl esters; 3-methyl-3-pentyl esters; 2,3,3-trimethyl-3-butyl esters; 1,2-dimethylcyclopentyl esters; 2,3,4-trimethyl-3-pentyl esters; 2,2,3,4,4-pentamethyl-3-pentyl esters; and adamantyl esters such as hydroxyadamantyl esters and $C_{1-12}$alkyladamantyl esters. Each of the aforementioned protected carboxyl groups can be cleaved by one or more of heat, acid or base. Preferably, the protected carboxyl groups are cleaved using heat, acid or a combination of heat and acid, and more preferably by heat. For example, these protected carboxyl groups can be cleaved at a pH of ≤4 and preferably ≤1. Such protected carboxyl groups may be cleaved at room temperature when in exposed to a pH in the range of 1 to 4. When the pH is <1, such protected carboxyl groups are typically heated to approximately 90 to 110° C., and preferably to approximately 100° C. Alternatively, when the protected carboxyl group is an ester having a quaternary carbon bonded directly to the alkoxy oxygen of the ester group, it can be cleaved by heating to a suitable temperature, such as ≥125° C., preferably from 125 to 250° C., and more preferably from 150 to 250° C. Such protected carboxyl groups, and their conditions of use, are well-known in the art, such as U.S. Pat. No. 6,136,501, which discloses various ester groups having a quaternary carbon bonded directly to the alkoxy oxygen of the ester group.

Protected hydroxyl groups are any group which is cleavable under certain conditions to yield a hydroxyl group. Such protected hydroxyl groups may be cleaved by heat, acid, base or a combination thereof. Exemplary protected hydroxyl groups include: ethers such as methoxymethyl ethers, tetrhydropyranyl ethers, tert-butyl ethers, allyl ethers, benzyl ethers, tert-butyldimethylsilyl ethers, tert-butyldiphenylsilyl ethers, acetonides, and benzylidene acetals; esters such as pivalic acid esters and benzoic acid esters; and carbonates such as tert-butylcarbonate. Each of the aforementioned protected hydroxyl groups can be cleaved under acidic or alkaline conditions, and preferably under acidic conditions. More preferably, the protected hydroxyl groups are cleaved using acid or a combination of acid and heat. For example, these protected hydroxyl groups can be cleaved at a pH of ≤4 and preferably ≤1. Such protected hydroxyl groups may be cleaved at room temperature when exposed to a pH in the range of 1 to 4. When the pH is <1, such protected hydroxyl groups are typically heated to approximately 90 to 110° C., and preferably to approximately 100° C. Such protected hydroxyl groups, and their conditions of use, are well-known in the art.

In addition to the surface treating moiety, the surface treating agent also comprises one or more relatively lower surface energy moieties (that is, relatively more hydrophobic moieties), such as $C_{3-20}$alkyl groups and $C_{6-20}$aryl groups. Such $C_{3-20}$alkyl group may be linear, branched or cyclic. Such $C_{6-20}$aryl groups include $C_{6-20}$aralkyl groups and $C_{6-20}$alkaryl groups, such as benzyl, phenethyl, tolyl, xylyl, ethylphenyl, styryl, and the like. It is believed that a branched or cyclic alkyl group is relatively more hydrophobic than the corresponding linear alkyl group, and that increasing the branching or cyclic nature of such a group helps lower the surface energy of the surface treating agent. Likewise, alkyl and aryl groups of increasing carbon chain length also lower the surface energy of the surface treating agent. Preferably, the surface treating agent comprises one or more relatively lower surface energy moieties chosen from $C_{4-20}$alkyl groups and $C_{6-20}$ aryl groups, and more preferably from $C_{4-16}$alkyl groups and $C_{6-16}$aryl groups. Typically, the surface treating agent comprises ≤20 mol % of a unit comprising the surface treating moiety, preferably ≤10 mol %, more preferably ≤7 mol %, and yet more preferably ≤5 mol %, with the remainder being composed of units comprising one or more relatively lower surface energy moieties.

The surface treating agent may be polymeric or non-polymeric, and is preferably polymeric. The surface treating polymer comprises as polymerized units one or more monomers comprising a surface treating moiety chosen from hydroxyl, protected hydroxyl, protected carboxyl, and mixtures thereof. Polymeric surface treating agents may be linear or branched and comprise one or more of: pendant groups comprising one or more surface treating moieties, terminal groups comprising one or more surface treating moieties, and a polymer backbone comprising one or more surface treating moieties. It is preferred that polymeric surface treating agents comprise pendant groups comprising one or more surface treating moieties, terminal groups comprising one or more surface treating moieties, or a combination thereof, and more preferably the polymeric surface treating agent comprises pendant groups comprising one or more surface treating moieties. In one preferred embodiment, the polymeric surface treating agent comprises ethylenically unsaturated monomers as polymerized units. It is further preferred that the polymeric surface treating agent comprises as polymerized units one or more monomers chosen from (meth)acrylate esters, styrene monomers, and hydroxystyrene monomers. Polymeric surface treating agents typically have a molecular weight of ≥1000 Daltons, preferably ≥5000 Daltons, more preferably ≥8000 Daltons, and even more preferably ≥10,000 Daltons.

Typically, the polymeric surface treating agents have a molecular weight of from 1000 to 50,000 Daltons, preferably from 5000 to 30,000, more preferably from 5000 to 25,000, yet more preferably from 5000 to 20,000 Daltons, and still more preferably from 8000 to 20,000 Daltons.

Any polymer comprising one or more surface treating moieties may suitably be used as the surface treating agent, provided that the monomer comprising the surface treating moiety is present in an amount of ≤20 mol %, preferably ≤10 mol %, more preferably ≤7 mol %, and yet more preferably ≤5 mol %, based on the total moles of the monomers used to form the polymer, and preferably the reminder of the polymer comprises monomers having relatively low surface energy. Exemplary monomers comprising one or more surface treating moieties include, but are not limited to, hydroxystyrenes, (meth)acrylate esters, and silsesquioxanes. Suitable hydroxystyrene monomers include hydroxystyrene, $C_{1-10}$alkyl-substituted hydroxystyrenes, and the like. Suitable (meth)acrylate esters comprising one or more surface treating moieties include, without limitation, alkyleneglycol (meth)acrylates, alkyl (meth)acrylates substituted with one or more hydroxyl groups in the alkyl radical, especially those where the hydroxyl group is found at the β-position (2-position) in the alkyl radical, and (meth)acrylate esters having a quaternary carbon bonded directly to the alkoxy oxygen of the ester group. Suitable alkyleneglycol (meth)acrylates have the general formula HO-(Alk-O)$_p$—C(O)—CHR$^a$=CH$_2$, where Alk is an alkylene group, p=1-100, and R$^a$=H or CH$_3$, preferably p=1-25, and more preferably p=1-10. In such alkyleneglycol (meth)acrylates, the alkylene glycol moiety is typically derived from ethylene glycol, propylene glycol, 1,3-propane diol, butylene glycol, and 1,4-butane diol. Preferred alkylene glycol (meth)acrylates include monoalkylene glycol (meth)acrylates such as ethyleneglycol (meth)acrylate and propyleneglycol (meth)acrylate, as well as poly(alkyleneglycol) (meth)acrylates such as diethylneglycol (meth)acrylate, triethyleneglycol (meth)acrylate, dipropyleneglycol (meth)acrylate, and tripropyleneglycol (meth)acrylate. Suitable hydroxyalkyl (meth)acrylate monomers are those in which the hydroxy-substituted alkyl group is a branched or unbranched $C_{2-20}$alkyl, and preferably a $C_{2-15}$alkyl. Preferred hydroxyalkyl (meth)acrylate monomers include, but are not limited to: 2-hydroxyethyl methacrylate (HEMA), 2-hydroxyethyl acrylate (HEA), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate, hydroxyadamantyl methacrylate, hydroxyadamantyl acrylate, and mixtures thereof. The preferred hydroxyalkyl (meth)acrylate monomers are HEMA, HEA, 1-methyl-2-hydroxyethyl methacrylate, 2-hydroxypropyl methacrylate and mixtures thereof. A mixture of the latter two monomers is commonly referred to as "hydroxypropyl methacrylate" or "HPMA." Suitable (meth)acrylate esters having a quaternary carbon bonded directly to the alkoxy oxygen of the ester group (that is, (meth)acrylic acid having a protected carboxyl group) include (meth)acrylate esters of any of the protecting groups disclosed in U.S. Pat. No. 6,136,501, adamantly (meth)acrylate esters, tert-butyl (meth)acrylate, and the like. Preferred (meth)acrylate esters having a quaternary carbon bonded directly to the alkoxy oxygen of the ester group include: tert-butyl (meth)acrylate, 1-methylcyclopentyl (meth)acrylate, 1-ethylcyclopentyl (meth)acrylate, 2,3-dimethyl-2-butyl (meth)acrylate, 3-methyl-3-pentyl (meth)acrylate, 2,3,3-trimethyl-3-butyl (meth)acrylate, 1,2-dimethylcyclopentyl (meth)acrylate, 2,3,4-trimethyl-3-pentyl (meth)acrylate, 2,2,3,4,4-pentamethyl-3-pentyl (meth)acrylate, and adamantyl (meth)acrylates including $C_{1-10}$alkyladamantyl (meth)acrylates. Suitable silsesquioxane monomers are those containing one or more hydroxyl groups bonded to silicon. Typically, such silsesquioxanes are available as oligomeric materials and may have ladder or caged structures, and preferably caged structures, such as polyhedral oligsilsesquioxane (POSS) monomers, such as those available from Sigma-Aldrich or Hybrid Plastics. Particularly suitable silsesquioxane monomers include, without limitation: 3,5,7,9,11,13,15-heptacyclopentylpentacyclo[9.5.1.1$^{3,9}$.1$^{5,15}$.1$^{7,13}$]-octasiloxane-1-ol; 1,3,5,7,9,11,14-heptacyclopentyltricyclo[7.3.3.1$^{5,11}$]heptasiloxane-endo-3,7,14-triol; 1,3,5,7,9,11,14-heptaisooctyltricyclo[7.3.3.1$^{5,11}$]heptasiloxane-endo-3,7,14-triol; 1,3,5,7,9,11,14-heptaethyltricyclo[7.3.3.1$^{5,11}$]heptasiloxane-endo-3,7,14-triol; 1,3,5,7,9,11,14-heptaphenyltricyclo[7.3.3.1$^{5,11}$]heptasiloxane-endo-3,7,14-triol; 1,3,5,7,9,11,14-heptaisobutyltricyclo[7.3.3.1$^{5,11}$]heptasiloxane-endo-3,7,14-triol; 1,3,5,7,9,11,14-heptacyclohexyltricyclo[7.3.3.1$^{5,11}$]heptasiloxane-endo-3,7,14-triol; and tricyclo[7.3.3.3$^{3,7}$]octasiloxane-5,11,14,17-tetraol-1,3,5,7,9,11,14,17-octaphenyl. Mixtures of any of the above monomers may also be used in the present compositions.

Suitable monomers having a relatively low surface energy typically include, without limitation, one or more $C_{3-20}$alkyl groups and $C_{6-20}$aryl groups. Examples of such monomers include, but are not limited to, styrenes and (meth)acrylate monomers. Preferred styrene monomers include styrene and $C_{1-12}$alkylstyrenes, such as α-methylstyrene, β-methylstyrene, 4-methylstyrene, 2-methylstyrene, α-ethylstyrene, and 4-ethylstyrene. Preferred (meth)acrylate monomers having a relatively low surface energy include $C_{3-20}$alkyl (meth)acrylate monomers, such as n-propyl (meth)acrylate, iso-propyl (meth)acrylate, n-butyl (meth)acrylate, iso-butyl (meth)acrylate, n-pentyl (meth)acrylate, iso-pentyl (meth)acrylate, ethylhexyl (meth)acrylate, cyclopentyl (meth)acrylate, and cyclohexyl (meth)acrylate. Mixtures of such monomers may also be used.

It will be appreciated by those skilled in the art that one or more other monomers may optionally be used in addition to the above monomers, such as to help solubility of the polymeric surface treating agent in the solvent used. Such other monomers include $C_{1-2}$alkyl (meth)acrylates, such as methyl acrylate, ethyl acrylate, methyl methacrylate and ethyl methacrylate, and mixtures thereof. When these monomers are used to form the surface treating agent, they are used in relatively low amounts, such as from 0 to 10 mol %, and preferably from 0 to 5 mol %. In a preferred embodiment, the polymeric surface treating agent is free of $C_{1-2}$alkyl (meth)acrylates.

Polymeric surface treating agents typically comprise ≤20 mol % of monomers comprising one or more surface treating moieties, and ≥70 mol % of relatively low surface energy monomers, and 0 to 10 mol % of other monomers. Preferably, the polymeric surface treating agents comprise ≤10 mol %, more preferably ≤7 mol %, and yet more preferably ≤5 mol % of monomers comprising one or more surface treating moieties. The polymeric surface treating agents of the invention are commercially available from a variety of sources, such as The Dow Chemical Company, Midland, Mich., or may be made according to various methods well-known in the art, such as by solution polymerization or emulsion polymerization. Such polymers may be used with or without further purification.

The present compositions also comprise one or more organic solvents. A wide variety of organic solvents may suitably be used, provided that the surface treating agent and the organo-metal compound are soluble in the solvent or mixture of solvents selected. Such solvents include, but are not limited to, aromatic hydrocarbons, aliphatic hydrocarbons, alcohols, lactones, esters, glycols, and glycol ethers. Mixtures of organic solvents may be used. Exemplary organic solvents include, without limitation, toluene, xylene, mesitylene, alkylnaphthalenes, 2-methyl-1-butanol, 4-methyl-2-pentanol, gamma-butyrolactone, ethyl lactate, 2-hydroxyisobutyric acid methyl ester, propylene glycol methyl ether acetate, and propylene glycol methyl ether. In a preferred embodiment, a solvent system comprising a majority of a first solvent and a minority of a second solvent is used. More preferably, the first solvent has a relatively low surface energy and the second solvent has a relatively higher boiling point than the first solvent, and where the second solvent has a higher surface energy (tension) than the surface energy of the surface treating agent. Exemplary second solvents include, but are not limited to, gamma-butyrolactone, gamma-valerolactone, dipropyleneglycol methyl ether, and the like. Typically, when a solvent mixture is used, the amount of the second solvent is present in an amount of 0.1 to 10 wt %, based on the total weight of the solvent system, with the remainder being the weight of the first solvent. Preferably, the organic solvents contain <10,000 ppm of water, more preferably <5000 ppm water, and even more preferably ≤500 ppm water. It is preferred that the organic solvents do not have free carboxylic acid groups or sulfonic acid groups.

The present compositions may optionally comprise one or more additives, such as thermal acid generators, photoacid generators, antioxidants, dyes, contrast agents and the like. When the surface treating agent comprises one or more protected hydroxyl groups, it is preferred that a thermal acid generator or a photoacid generator be used. In general, the amount of the thermal acid generator in the surface treating composition is from 0 to 10 wt %, preferably from 1 to 8 wt %, and more preferably from 2 to 6 wt %. The amount of the photoacid generator in the surface treating compositions is typically from 0 to 10 wt %, preferably from 1 to 8 wt %, and more preferably from 4 to 6 wt %.

Thermal acid generators (TAGs) are well-known in the art. In general, TAGs may be activated by heating, such as ≥90° C. and preferably from 120 to 150° C., to generate an acid which can cleave the protecting group to form the unprotected carboxyl or hydroxyl group, as the case may be. Exemplary TAGs include: nitrobenzyl tosylates such as 2-nitrobenzyl tosylate, 2,4-dinitrobenzyl tosylate, 2,6-dinitrobenzyl tosylate, and 4-nitrobenzyl tosylate; benzenesulfonates such as 2-trifluoromethyl-6-nitrobenzyl 4-chlorobenzenesulfonate, and 2-trifluoromethyl-6-nitrobenzyl 4-nitro benzenesulfonate; phenolic sulfonate esters such as phenyl, and 4-methoxybenzenesulfonate; and amine or alkyl ammonium salts of organic acids, such as triethylammonium salt of 10-camphorsulfonic acid, amine blocked dodecylbenzenesulfonic acid, and quaternary ammonium blocked triflic acid. A variety of aromatic (anthracene, naphthalene or benzene derivatives) sulfonic acid amine salts can be employed as the TAG, including those disclosed in U.S. Pat. Nos. 3,474,054; 4,200,729; 4,251,665; and 5,187,019. Typically, the TAG will have a very low volatility at temperatures between 170 and 220° C. Examples of TAGs include those sold by King Industries, Norwalk, Conn., USA under NACURE™, CDX™ and K-PURE™ names.

Photoacid generators (PAGs) are well-known in the art and are activated upon exposure to certain wavelengths of light, such as g-, h-, or i-line, 248 nm, 193 nm, or other suitable wavelength, or upon exposure to a beam of electrons (e-beam) to generate an acid which can cleave the protecting group to form the unprotected carboxyl or hydroxyl group, as the case may be. Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris(trifluoromethanesulfonyloxy) benzene, and 1,2,3-tris(p-toluenesulfonyloxy)benzene; diazomethane derivatives, for example, bis(benzenesulfonyl) diazomethane, bis(p-toluenesulfonyl)diazomethane; glyoxime derivatives, for example, bis-O-(p-toluenensulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis (trichloromethyl)-1,3,5-triazine, and 2-(4-methoxynaphthyl)-4,6-bis(trichloromethyl)-1,3,5-triazine. One or more of such PAGs can be used. Suitable PAGs are available from a variety of sources, such as from BASF (Ludwigshafen, Germany) under the IRGACURE™ brand.

The present compositions may be prepared by combining the surface treating agent, organic solvent, and any optional additives, such as a TAG or PAG, in any order. It will be appreciated by those skilled in the art that the concentration of the components in the present compositions may be varied across a wide range. Preferably, the surface treating agent is present in the composition in an amount of from 0.1 to 10 wt %, preferably from 0.1 to 5 wt %, more preferably from 0.1 to 3 wt %, and yet more preferably from 0.5 to 3 wt %, based on the total weight of the composition. Preferably, the organo-metal compound is present in the composition in an amount of from 0.5 to 35 wt %, more preferably from 1 to 30 wt %, yet more preferably from 1.5 to 35 wt %, and even more preferably from 1.5 to 25 wt %. It will be appreciated by those skilled in the art that higher or lower amounts of such components may be used in the present compositions.

In use, the present compositions are disposed on an electronic device substrate. A wide variety of electronic device substrates may be used in the present invention, such as, packaging substrates such as multichip modules; flat panel display substrates; integrated circuit substrates, substrates for light emitting diodes (LEDs), semiconductor wafers, polycrystalline silicon substrates, and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Particularly suitable substrates for hardmask layers are patterned wafers, such as patterned silicon wafers, patterned sapphire wafers, and patterned gallium-arsenide wafers. Such wafers may be any suitable size. Preferred wafer diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated.

The present compositions may be disposed on an electronic device substrate by any suitable means, such as spin-coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15-90 seconds to obtain a desired layer of the organo-metal compound of the substrate. It will be appreciated by those skilled in the art that the height of the organo-metal compound layer may be adjusted by changing the spin speed, as well as the percentage solids in the composition.

While not wishing to be bound by theory, it is believed that the surface treating agent migrates toward the surface of the forming film during deposition of the present compositions and/or during any subsequent solvent removal step. It is believed that the relatively low surface energy of the surface treating agent helps drive the surface treating agent to the air interface. It will be appreciated by those skilled in the art that such migration of the surface treating agent should substantially occur before the complete curing of the oxymetal hardmask film. The formation of a cured oxymetal hardmask film substantially prohibits migration of the surface treating agent.

During or after the deposition of the present compositions on a substrate to form an organo-metal compound layer, the layer is optionally baked at a relatively low temperature to remove any remaining solvent and other relatively volatile components from the organo-metal compound layer. Typically, the substrate is baked at a temperature of ≤125° C., preferably from 60 to 125° C., and more preferably from 90 to 115° C. The baking time is typically from 10 seconds to 10 minutes, preferably from 30 seconds to 5 minutes, and more preferably from 6 to 180 seconds. When the substrate is a wafer, such baking step may be performed by heating the wafer on a hot plate.

Following any baking step to remove solvent, the organo-metal compound layer is cured, such as in an oxygen-containing atmosphere, such as air. The curing step is conducted preferably on a hot plate-style apparatus, though oven curing may be used to obtain equivalent results. Typically, such curing is performed by heating the organo-metal compound layer at a curing temperature of ≥150° C., and preferably 150 to 310° C. It is more preferred that the curing temperature is ≥200 to 310° C., still more preferably ≥250 to 310° C., and even more preferably from 250 to 300° C. The choice of final curing temperature depends mainly upon the desired curing rate, with higher curing temperatures requiring shorter curing times. As the surface treating agent is present at the surface of the organo-metal compound layer, the temperature used to cure the organo-metal compound layer should be selected such that the surface treating agent does not substantially decompose. If higher curing temperatures are required, then more thermally stable surface treating agents, such as vinylaryl polymers such as hydroxystyrene polymers and polyhedral oligosilsesquioxane polymers may be used. Typically, the curing time may be from 10 seconds to 10 minutes, preferably from 30 seconds to 5 minutes, more preferably from 45 seconds to 5 minutes, and yet more preferably from 60 to 180 seconds. This curing step is performed in order to thermally decompose at least a portion of the organo-metal compound so that a hardmask layer containing oxymetal domains having an $(-M-O-)_n$ linkage, where n>1, preferably n>2, more preferably n>5, yet more preferably n>10, and even more preferably n>25 are obtained. Typically, the amount of the metal in the cured oxymetal domain-containing films may be up to 95 mol % (or even higher), and preferably from 50 to 95 mol %. Hardmask layers formed from the present compositions contain oxy-metal domains, and may contain other domains, such as metal nitride domains, as well as optionally containing carbon, such as an amount of up to 5 mol % carbon.

While not wishing to be bound by theory, it is believed that as a result of this curing step any protected hydroxyl group and/or protected carboxyl group may be cleaved to form the respective hydroxyl and carboxyl groups as surface active moieties. When the present composition comprises an optional TAG, the organo-metal compound layer should be heated to a temperature sufficient to activate the TAG and generate an acid. This heating step should be sufficient to both generate the acid and deprotect any surface active moiety (carboxyl and/or hydroxyl) in the presence of the generated acid as well as facilitate any binding of the surface treating agent to the oxymetal hardmask surface. Typically, the temperature used to cure the organo-metal compound layer to form the oxymetal hardmask layer is sufficient to activate the TAG and generate the resulting acid.

Alternatively, when a PAG is used in the present compositions, the organo-metal compound layer may be exposed to light of an appropriate wavelength or to an electron beam to generate the corresponding acid in order to facilitate the liberation of hydroxyl and carboxyl groups from protected hydroxyl groups and protected carboxyl groups, respectively. Once sufficient acid is generated, the acid will start to deprotect any surface active moiety (carboxyl and/or hydroxyl). Such exposure step may occur before, during or both before and during the step of curing the organo-metal compound layer to form the oxymetal hardmask film.

Further, it is believed that the curing step to form the oxymetal hardmask layer also causes the surface active moieties to bind to the surface of the oxymetal hardmask, thereby modifying the surface energy and, accordingly, the water contact angle. After the surface treating agent has been allowed to interact (for example, bond) with the oxymetal hardmask surface, any unreacted (or un-bound) surface treating agent is optionally removed by rinsing with a suitable organic solvent, and is preferably removed by rinsing. Any of the above described organic solvents useful for forming the present compositions may be used in this rinsing step. While not wishing to be bound by theory, it is believed that after such rinsing, a monolayer of the surface treating agent remains on the surface of the metal hardmask layer. While the present invention has been described in terms of forming oxymetal hardmasks, it is believed that such or similar compositions are useful to form other hardmask materials, such as silsesquioxane-containing hardmasks, metal nitride hardmasks and silicon nitride hardmasks, or hardmasks formed by thermal treatment of coatings of organometallic polymeric materials which form films primarily comprised of silicon oxides, metal nitrides or silicon nitrides, having properties as described herein.

The use of the present compositions results in an oxymetal hardmask layer having a surface with a sufficiently low surface energy (as measured by static water contact angle) that a separate surface treatment step to lower the surface energy is not needed. The present compositions provide oxymetal hardmask layers having a surface energy that substantially matches that of a subsequently applied organic layer, that is, the surface energy of the hardmask layer should be within 20% of the surface energy of a subsequently applied organic layer, and preferably within 10%. As surface energy is often difficult to measure directly, surrogate measurements, such as water contact angles, are typically used. The determination of water contact angles is well-known, and a preferred method uses using a Kruss drop shape analyzer Model 100, using deionized (DI) water and a 2.5 μL drop size. Conventional oxymetal hardmask layers having a majority of inorganic domains with (-M-O—)$_n$ linkages, where M is a metal and n>1, typically have a water contact angle of <50°, such as from 35 to 45°. Oxymetal hardmask layers of the present invention typically have a water contact angle of ≥55 and preferably ≥60. Films of the present compositions may be blanket cured to form an oxymetal hardmask layer having a relatively low surface energy, such as having a static water contact angle of ≥55°. Preferably, the oxymetal hardmask has a static water contact angle of 55 to 70°, and more preferably from 60 to 70°.

Alternatively, films of the present compositions may be pattern cured to form an oxymetal hardmask layer having a pattern of regions of relatively lower surface energy, such as regions having a static water contact angle of ≥55°, and regions of relatively higher surface energy, such as regions having a static water contact angle of ≤50°. When a patterned surface having regions of different surface energies is formed, it is preferred that a first region of relatively lower surface energy has a water contact angle of 55 to 70°, and a second region of relatively higher surface energy has a water contact angle of 25 to 50°. More preferably, the first region has a water contact angle of 60 to 70°. Yet more preferably, the second region has a water contact angle of 30 to 50°, and still more preferably from 30 to 45°. The oxymetal hardmask surface may have a plurality of first and second regions.

Accordingly, the present invention provides a method of forming a patterned oxymetal hardmask comprising: providing a substrate; coating a film of a composition comprising an organo-metal compound; a surface treating agent having a surface energy of 20 to 40 erg/cm$^2$ and comprising a surface treating moiety chosen from protected hydroxyl, protected carboxyl, and mixtures thereof; and a solvent on a surface of the substrate; causing the surface treating agent to migrate to the surface of the film; and curing the film to form an oxymetal hardmask layer having a patterned surface comprising regions of different surface energies. Such patterned oxymetal hardmask layer has a first region of a relatively lower surface energy and a second region of relatively higher surface energy, as measured by static water contact angles. Such regions of different surface energies may be obtained by selectively causing areas of the oxymetal hardmask surface to interact (or bond) with the surface active moieties of the surface treating agent while the surface treating agent does not interact (or bond) with other areas of the hardmask surface. For example, an electron beam can be used to deprotect surface active moieties in certain regions of the hardmask surface, after which, such regions will have a relatively lower surface energy as compared to regions of the hardmask film not exposed to the electron beam. Likewise, a laser could be used to selectively heat certain regions of the hardmask surface to deprotect surface active moieties in those regions, after which such regions will have a relatively lower surface energy as compared to regions of the hardmask film not exposed to the laser. Similarly, when a PAG is used in the present compositions, exposure of the hardmask surface to appropriate patterned actinic radiation will result in acid formation in the areas exposed to light. Following a heating step to cause the deprotected surface active moieties to interact (or bind) to the oxymetal hardmask surface, and optionally a rinsing step, an oxymetal hardmask having regions of relatively lower surface energy (in the regions exposed to light) and regions having relatively higher surface energy (in regions not exposed to light) is obtained.

In one application, oxymetal hardmask layers are typically used to provide etch selectivity and as part of a bottom antireflective coating (BARC) stack, particularly in the manufacture of electronic devices. Metal hardmask layers typically comprise a majority of inorganic domains having (-M-O—)$_n$ linkages, where M is a Group 3 to Group 14 metal and n is an integer >1. Mixtures of different metals may be used to prepare the hardmask layer. Preferably, M is a metal chosen from one or more of Groups 4, 5, 6 and 13, and more preferably from Groups 4, 5 and 6. It is preferred that M is chosen from one or more of titanium, zirconium, hafnium, tungsten, tantalum, molybdenum, and aluminum, more preferably titanium, zirconium, hafnium, tungsten, tantalum, and molybdenum, and still more preferably zirconium, hafnium, tungsten, and tantalum. Preferably, n>2, more preferably n>5, and yet more preferably n>10. As the hardmask layer is typically prepared by curing a film to provide a network of metaloxygen domains, there is no practical upper limit to the value of n. The hardmask layer may also comprise a minority of domains having -M-OH, -M-O—C— or -M-O—X— linkages, where M is as defined above and X may be an element other than H, C or M.

In one application, such as when the oxy-metal hardmask layer is blanket cured, that is not patterned, an organic coating layer is deposited on the oxymetal hardmask surface. Suitable organic layers include, without limitation, antireflective coatings, photoresists, dielectric coatings, permanent adhesives, temporary bonding adhesives, and the like. Preferably, the subsequent organic coating layer is chosen from one or more of antireflective coatings, photoresists, and dielectric coatings, and more preferably from antireflective coatings, and photoresists. Typically, a photoresist layer has a water contact angle of 60 to 70°. Any variety of suitable organic coatings may be applied to the oxymetal hardmask layer by any suitable method, such as those described above for depositing the present compositions. Spin-coating is a preferred method. Exemplary antireflective coatings include those available from Brewer Science under the ARC™ brand and from Dow Electronic Materials (Marlborough, Mass.) under the AR™ brand, such as AR137 antireflectant. A wide variety of photoresists are suitable, for example, those used in 193 nm lithography, such as those sold under the EPIC brand available from Dow Electronic Materials. Suitable photoresists may be either positive tone or negative tone development resists. In one preferred embodiment, a photoresist layer is disposed on the treated hardmask layer. In a second preferred embodiment, an antireflective coating layer is disposed on the treated hardmask layer, and a photoresist layer is disposed on the antireflective coating layer. Following coating on the treated hardmask layer, the organic coating layer may subjected to subsequent processing. For example, a photoresist layer is then imaged (exposed) using patterned actinic radiation, and the exposed photoresist layer is then developed using the appropriate developer to provide a patterned photoresist layer. The pattern is next transferred from the photoresist layer to the underlying hardmask layer and substrate by appropriate etching techniques known in the art, such as by plasma etching. Following etching, the photoresist layer, any antireflective coating material layer present, and the hardmask layer are removed using conventional techniques. The electronic device substrate is then processed according to conventional means.

In another application, a patterned oxymetal hardmask layer may be used to pattern subsequently applied organic materials. For example, when a conventional 193 nm photoresist or an organic antireflective coating is disposed on an oxymetal hardmask containing a first region of relatively lower surface energy, such as having a water contact angle of 60 to 65°, and a second region of relatively higher surface energy, such as ≤40°, the photoresist or organic antireflective coating will preferentially align with the first region. Alternatively, such patterned oxymetal hardmask may be used to order subsequently applied organic materials such as block copolymers used in directed self assembly processes. Such block copolymers contain at least two regions (or blocks) of dissimilar monomers. These block copolymers can be selected such that one block has a surface energy that substantially matches the surface energy of one of the regions of the oxymetal hardmask surface. As a result, the block copolymer will naturally align with the pattern on the hardmask surface. Such patterns of organic material on the patterned oxymetal hardmask layer may be used to produce a variety of electronic devices.

EXAMPLE 1

A protected carboxylic acid surface treating polymer (90/10 nBMA/tBA) was prepared as follows. A monomer/initiator feeding solution was prepared by adding the following to a glass vial: 53.99 g of n-butyl methacrylate (nBMA), 6.01 g of tert-butyl acrylate (tBA) and 30.02 g of 2-methyl-1-butanol. The vial was gently shaken to mix its content and then placed in an ice bath to reach temperature equilibrium with the ice bath. Next, 1.80 g of dimethyl 2,2'-azobis(2-methylpropionate) initiator (available under the tradename V-106 from Wako Pure Chemical Industries, Ltd.) was added to the vial, followed by shaking to completely dissolve the initiator. The vial was then placed back in the ice bath until needed.

A 250 mL 3-neck round-bottomed flask containing a magnetic stir bar and equipped with a thermocouple, a condenser without cooling water circulation, and a monomer/initiator feed line was set up in a heating mantel. The heating mantle was controlled by a thermal control through the thermocouple. 2-Methyl-1-butanol (60 g) was added to the flask and the temperature was brought to 99° C. with adequate stirring. Monomer/initiator solution was fed to the flask at a rate of 250 μL/13 sec. using a Hamilton dual syringe pump while maintaining the reactor temperature at 99° C. with stirring. Upon completion of the addition of the monomer/initiator solution, the flask was maintained at 99° C. for an additional 2 hours. The heat was then removed and the reaction mixture (polymer solution) allowed to cool to room temperature. The polymer solution was then used as is without further purification. The weight ratio of nBMA/tBA was 90/10.

The polymer content in the polymer solution was determined using a weight loss method in a thermal oven at ca. 110° C. for ca. 15 min. In this test, 0.093 g of the polymer solution was weighed into an aluminum pan with its tare weight predetermined. The polymer content was found to be 38.0%.

EXAMPLE 2

A protected carboxylic acid surface treating polymer (90/10 nBMA/233tMBA) was prepared according to the procedure of Example 1, except that the monomer/initiator feed solution was prepared using 53.99 g of b-butyl methacrylate (nBMA), 6.01 g of 2,3,3-trimethyl-3-butyl acrylate (233tMBA) and 30.01 g of 2-methyl-1-butanol. The polymer content in the resulting polymer solution was found to be 37.2%.

EXAMPLE 3

A hydroxyl group containing surface treating polymer (97/3 nBMA/HEMA) was prepared according to the procedure of Example 1, except that the monomer/initiator feed solution was prepared using 58.2 g of n-butyl methacrylate (nBMA), 1.878 g of hydroxyethyl methacrylate (HEMA) and 30.00 g of 2-methyl-1-butanol. The polymer content in the resulting polymer solution was found to be 37.5%.

EXAMPLE 4

Surface treating polymers are prepared substantially according to the procedure of Example 1 using the monomers and amounts shown in Table 1. The abbreviations in Table 1 have the following meanings: nBA=n-butyl acrylate; tBA=tertiary-butyl acrylate; tBMA=tert-butyl methacrylate; EHA=ethylhexyl acrylate; HMA=hexyl methacrylate; HEMA=hydroxyethyl methacrylate; HPMA=hydroxypropyl methacrylate; 233tMBA=2,3,3-trimethyl-3-butyl acrylate; and DMBMA=2,3-dimethyl-2-butyl methacrylate.

TABLE 1

| Surface Treating Polymer | Monomer 1 (wt %) | Monomer 2 (wt %) | Monomer 3 (wt %) |
| --- | --- | --- | --- |
| A | nBMA (97) | tBA (3) | — |
| B | nBMA (95) | tBMA (5) | — |
| C | EHA (90) | tBMA (10) | — |
| D | HMA (95) | DMBMA (5) | — |
| E | nBMA (85) | EHA (5) | HEMA (10) |
| F | EHA (95) | 233tMBA (5) | — |
| G | nBA (93) | HPMA (7) | — |
| H | nBA (90) | EHA (5) | DMBMA (5) |

EXAMPLE 5

Preparation of Hf(OBu)Acetyl-Diethylene Glycol Copolymer

A 500 mL three-necked flask was equipped with a reflux condenser, a mechanical stirrer and an addition funnel. To this reactor was added 100 g (0.21 mol) of Hf(OBu)$_4$ (available from Gelest Inc.). To this vigorously stirred material was added pentane-2,4-dione (42.5 g, 0.42 mol) very slowly over 6 hours. The reaction mixture was stirred overnight at room temperature. N-butanol produced during the reaction was removed under vacuum and then 800 mL of ethyl acetate was added and the reaction flask was stirred vigorously at room temperature for 30 min. This solution was filtered through a fine frit to remove any insoluble products. Remaining solvent was removed under vacuum and a pale white solid was obtained (100.4 g, 90% yield). This product, Hf(OBu)$_2$(acac)$_2$, was used without further purification.

To a 1 L three-necked flask equipped with a reflux condenser, a stirring bar and a thermal meter was added an ethyl acetate (500 mL) solution of the above product (100.4 g, 0.19 mol) and ethylene diglycol (19.4 g, 0.18 mol). The reaction mixture was refluxed at 80° C. for 24 hours. The reaction mixture was filtered through a fine frit and then dried under vacuum. The brown-white solid was washed with heptane (3×1 L) and then dried under strong vacuum for 2 hours, yielding the desired Hf(OBu)acetyl-diethylene glycol copolymer (Hf BuO-Acetyl DEG) as a white powder (67 g). The product obtained had the following structure.

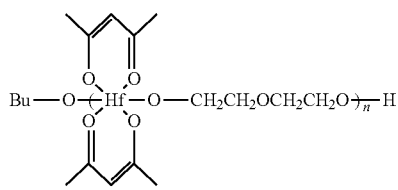

EXAMPLE 6

Preparation of Ti(OR)Acetyl-Diethylene Glycol (Ti OR-Acetyl DEG) Copolymers

To a flask equipped with a Dean-Stark trap were added 50 g of Ti(OR)$_2$(acac)$_2$ (R=ethyl or isoporopyl, Tyzor AA-105, available from DuPont) and an equimolar amount of diethyleneglycol at room temperature. The mixture was heated to 125° C., stirred for 1-2 days and the distillate collected. The mixture was then cooled and quenched in heptane (500 mL). The resulting precipitate was collected and dried in vacuum to give 35 g of the desired product having the structure shown in the following formula.

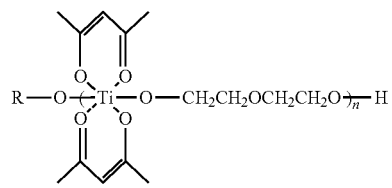

EXAMPLE 7

Preparation of Zr(OBu)Acetyl-Diethylene Glycol Copolymer

Zirconium bis(acetylacetone)-bis(n-butoxide) (or Zr(acac)$_2$(OBu)$_2$), 25 wt % in toluene/butanol, was obtained from Gelest Inc. and used without further purification. The solvent was removed from 200 g of Zr(acac)$_2$(OBu)$_2$, and the residue was diluted with 250 mL ethyl acetate. To this mixture was added an equimolar amount of diethyleneglycol at room temperature and then the mixture was refluxed at 80° C. for 18 hr. Next, the reaction mixture was cooled and filtered to remove a white precipitate. The filtrate was concentrated to a small volume using a rotary evaporator and the residue quenched in heptane. The precipitate was then collected and dried in vacuum to give 20.8 g of Zr(OBu)acetyl-diethylene glycol copolymer (Zr BuO-Acetyl DEG) as the desired product, whose structure is shown by the following formula.

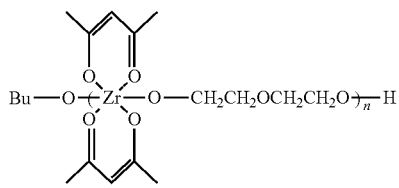

EXAMPLE 8

Hardmask compositions were prepared by combining the Hf BuO-Acetyl DEG from Example 5 and various amounts of the nBMA/tBA surface treating polymer from Example 1 in a mixed solvent system in the amounts shown in Table 2. The Control sample contained no surface treating polymer. The amount of the surface treating polymer in Samples 1-3 was 0.5%, 1.0% and 1.5%, respectively, based on the amount of Hf BuO-Acetyl DEG in the sample. Each sample was filtered with 0.2 μm polytetrafluoroethylene (PTFE) syringe filter 3 to 4 times before being coated on bare silicon wafers at 1500 rpm followed by baking at 280° C. for 60 sec. Static water static contact angles of the cured oxymetal hardmask films were then measured without significant delay using a Kruss drop shape analyzer Model 100, using DI water and a 2.5 μL drop size. The water contact angles are reported in Table 2.

TABLE 2

| | Control | Sample 1 | Sample 2 | Sample 3 |
|---|---|---|---|---|
| Hf BuO-Acetyl DEG (neat) | 0.570 g | 0.570 g | 0.570 g | 0.570 g |
| 90/10 nBMA/tBA | — | 0.0075 g | 0.015 g | 0.023 g |
| gamma-Butyrolactone | 0.750 g | 0.750 g | 0.750 g | 0.750 g |
| 2-methyl-1-butanol | 13.68 g | 13.67 g | 13.59 g | 13.59 g |
| Water Contact Angle of Cured Film | 52.3° | 54.4° | 58.0° | 65.2° |

A clear increasing trend in static water contact angle is seen with an increasing amount of the surface treating polymer in the sample. The hardmask film obtained from Sample 3, which contained a loading of 1.5% surface treating polymer relative to the Hf BuO-Acetyl DEG compound), had a static water contact angle slightly over 65° which is similar to that of a photoresist.

EXAMPLE 9

A hardmask composition was prepared by combining 0.570 g of Hf BuO-Acetyl DEG (neat) from Example 5, 0.033 g of 97/3 nBMA/HEMA surface treating polymer from Example 3 in a mixed solvent system of 0.762 g gamma-butyrolactone and 13.662 g of 2-methyl-1-butanol. The surface treating polymer was 2% relative to the amount of the Hf BuO-Acetyl DEG used. The sample was filtered with 0.2 μm PTFE syringe filter before being coated on a bare silicon wafers at 1500 rpm followed by baking at 250° C. for 90 sec. The wafer was then stored under conventional FAB (cleanroom) atmosphere for 12 hours. Next, one-half of the wafer was submersed in propylene glycol methyl ether acetate (PGMEA) for 60 sec. followed by jet air drying. The static water contact angle on each half of the wafer was measured according to the procedure in Example 8, and found to be 61.4° for the hardmask film that was not contacted with PGMEA and 63.1° for hardmask film that was contacted with PGMEA. These results show that the surface treating polymer is not washed off the surface after curing of the hardmask film.

EXAMPLE 10

Hardmask compositions were prepared by combining the Hf BuO-Acetyl DEG from Example 5 and the surface treating polymers from Examples 1-3 in a mixed solvent system in the amounts shown in Table 3. The Control sample contained no surface treating polymer. The amount of the surface treating polymer in each of Samples 4-6 was 1.5% based on the amount of Hf BuO-Acetyl DEG in the sample. The total solids content for each Sample was 3%. Each sample was filtered with 0.2 µm PTFE syringe filter 3 to 4 times before being coated on bare silicon wafers at 1500 rpm followed by baking at 280° C. for 60 sec. Static water static contact angles of the cured oxymetal hardmask films were then measured without significant delay using a Kruss drop shape analyzer Model 100, using DI water and a 2.5 µL drop size, and then again after 24 hours storage in a convention FAB atmosphere. The water contact angles are reported in Table 3. As shown by the data, the hardmask films resulting from the present compositions showed much less change in static water contact angle with time as compared to the Control sample.

TABLE 3

|  | Control | Sample 4 | Sample 5 | Sample 6 |
|---|---|---|---|---|
| Hf BuO-Acetyl DEG (neat) | 0.450 g | 0.443 g | 0.444 g | 0.443 g |
| 90/10 nBMA/tBA | — | 0.0175 g | — | — |
| 90/10 nBMA/233tMBA | — | — | 0.0179 g | — |
| 97/3 nBMA/HEMA | — | — | — | 0.75 g |
| gamma-Butyrolactone | 0.750 g | 0.750 g | 0.750 g | 0.750 g |
| 2-methyl-1-butanol | 13.80 g | 13.79 g | 13.79 g | 13.79 g |
| Water Contact Angle of Cured Film - No Delay | 33.9° | 56.6° | 53.3° | 57.5° |
| Water Contact Angle of Cured Film - After 24 Hours | 40.3° | 58.5° | 56.1° | 60.4° |
| Change in Contact Angle | 6.4° | 1.9° | 2.8° | 2.9° |

EXAMPLE 11

Various hardmask compositions are prepared using various organometal compounds and the surface treating polymers of Examples 1-4, in the amounts shown in Table 4. The abbreviations in Table 4 have the following meanings: GBL=gamma-butyrolactobe; GVL=gamma-valerolactone; DPGME=dipropylene glycol methyl ether; PGME=propylene glycol methyl ether; (-TSA-TEA=p-toluenesulfonic acid tetraethylammonium salt (a thermal acid generator); and PnP=propylene glycol n-propyl ether.

TABLE 4

| Sample | Organometal Compound | Surface Treating Polymer | Solvent | Additives |
|---|---|---|---|---|
| 7 | Zr BuO-Acetyl DEG (0.5 g) | 90/10 nBMA/233tMBA (0.018 g) | GBL (0.6 g) 2-Methyl-1-butanol (14 g) | — |
| 8 | Zr BuO-Acetyl DEG (0.5 g) | 97/3 nBMA/HEMA (0.017 g) | GVL (0.8 g) 4-Methyl-2-pentanol (15 g) | — |
| 9 | Ti OR-Acetyl DEG, R = Et (0.6 g) | 95/5 HMA/DMBMA (0.018 g) | DPGME (0.7 g) PGMEA (14 g) | — |
| 10 | Ti OR-Acetyl DEG, R = Et (0.65 g) | 85/5/10 nBMA/EHA/HEMA (0.019 g) | DPGME (0.65 g) PGMEA (13 g) | — |
| 11 | Ti OR-Acetyl DEG, R = i-Pr (0.75 g) | 93/7 nBA/HPMA (0.02 g) | GVL (0.65 g) 4-Methyl-2-pentanol (13 g) | p-TSA-TEA (2 g) |
| 12 | 75/25 Zr(OBu)$_3$ methacrylate/tBA random copolymer (10 g) | 95/5 EHA/233tMBA (0.25 g) | DPGME (3 g) 2-Methyl-1-butanol (35 g) | — |
| 13 | Zr(OBu)$_3$ acrylate homopolymer (8 g) | 93/7 nBA/HPMA (0.25 g) | DPGME (2.5 g) 2-Methyl-1-butanol (30 g) | Ammonim triflate (2 g) |
| 14 | Ti(O-i-Pr)$_3$ acrylate homopolymer (10 g) | 90/5/5 nBA/EHA/DMBMA (0.3 g) | DPGME (0.8 g) 2-Methyl-1-butanol (30 g) | — |
| 15 | Poly(dibutyltitanate) (10 g) | 90/10 EHA/tBMA (0.33 g) | GVL (7 g) PGME (35 g) | — |
| 16 | Zr di-n-butoxide(bis-2,4-pentanedionate) (10 g) | 95/5 HMA/DMBMA (0.3 g) | GVL (5 g) PnP (35 g) | p-TSA-TEA (1.5 g) |

EXAMPLE 12

Hardmask compositions were prepared by combining the Hf BuO-Acetyl DEG from Example 5 and various polyhedral oliosilsesquioxane (POSS) materials as the surface treating polymers in a mixed solvent system in the amounts shown in Table 5. Trisilanolphenyl POSS is 1,3,5,7,9,11,14-heptaphenyltricyclo[7.3.3.1$^{5,11}$]heptasiloxane-endo-3,7,14-triol and Trisilanolisooctyl POSS is 1,3,5,7,9,11,14-heptaisooctyltricyclo[7.3.3.1$^{5,11}$]heptasiloxane-endo-3,7,14-triol, both available from Hybrid Plastics.

TABLE 5

|  | Sample 17 | Sample 18 |
|---|---|---|
| Hf BuO-Acetyl DEG (neat) | 0.54 g | 0.54 g |
| Trisilanolphenyl POSS | 0.319 g | — |
| Trisilanolisooctyl POSS | — | 0.324 g |
| gamma-Butyrolactone | 0.750 g | 0.750 g |
| PGME | 13.39 g | 13.39 g |

Both samples were filtered through 0.2 µm PTFE syringe filters multiple times before being coated on bare silicon wafers at 1500 rpm followed by baking at various temperatures of 250 or 280° C., 310° C. and 350° C. for 60 sec at each temperature. Two wafers were coated for each curing temperature used, and after curing one of these wafers was contacted with PGMEA followed by a baking step at 105° C. for 60 sec. Static water static contact angles of the cured oxymetal hardmask films on all wafers were measured according to the procedure of Example 8. The water contact angles are reported in Table 6.

TABLE 6

| Sample | | 250° C. | 310° C. | 350° C. |
|---|---|---|---|---|
| 17 | Before PGMEA strip | 46.0° | 44.4° | 37.6° |
|  | After PGMEA strip | 46.2° | 43.8° | 37.7° |

| Sample | | 280° C. | 310° C. | 350° C. |
|---|---|---|---|---|
| 18 | Before PGMEA strip | 85.9° | 68.2° | 49.3° |
|  | After PGMEA strip | 84.8° | 71.3° | 47.5° |

What is claimed is:

1. A hardmask composition comprising: an organo-metal compound; a surface treating polymer having a surface energy of 20 to 40 erg/cm$^2$ and comprising as polymerized units one or more monomers comprising a surface treating moiety chosen from hydroxyl, protected hydroxyl, protected carboxyl, and mixtures thereof; and a solvent; wherein the organo-metal compound is polymeric.

2. A hardmask composition comprising: an organo-metal compound; a surface treating polymer having a surface energy of 20 to 40 erg/cm$^2$ and comprising as polymerized units one or more monomers comprising a surface treating moiety chosen from hydroxyl, protected hydroxyl, protected carboxyl, and mixtures thereof; and a solvent; wherein the organo-metal compound is chosen from:

(i) oligomer comprising Group 3 to Group 14 metal-containing pendant groups;
(ii) compounds of formula (2)

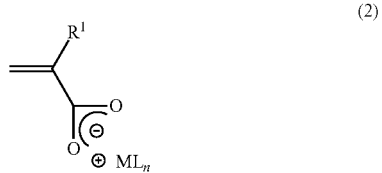

(2)

where R$^1$=H or CH$_3$; M=a Group 3 to Group 14 metal; L is a ligand; and n refers to the number of ligands and is an integer from 1-4;

(iii) compounds of formula (3)

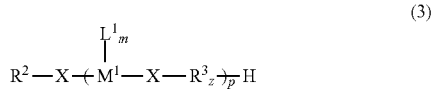

(3)

where R$^2$=(C$_1$-C$_6$)alkyl; M$^1$ is a Group 3 to Group 14 metal; R$^3$=(C$_2$-C$_6$)alkylene-X— or (C$_2$-C$_6$)alkylidene-X—; each X is independently chosen from O and S; z is an integer from 1-5; L$^1$ is a ligand; m refers to the number of ligands and is an integer from 1-4; and p=an integer from 2 to 25; and (iv) mixtures thereof.

3. The composition of claim 1 wherein the surface treating polymer comprises a protected carboxyl group.

4. The composition of claim 3 wherein the protected carboxyl comprises an ester having a quaternary carbon bonded directly to the alkoxy oxygen of the ester group.

5. The composition of claim 1 wherein the surface treating polymer is present in an amount of 0.5 to 50 wt %, based on the weight of the composition.

6. The composition of claim 1 wherein the organo-metal compound comprises a Group 3 to Group 14 metal.

7. A method of forming a metal hardmask layer comprising: providing a substrate; coating a film of the composition of claim 1 on a surface of the substrate; and curing the film to form a metal hardmask layer.

8. The method of claim 7 wherein the cured hardmask has a water contact angle of 55 to 70°.

9. The method of claim 7 free of a separate step of contacting the metal hardmask layer with a surface treating agent.

10. A method of forming a patterned oxymetal hardmask comprising: providing a substrate; coating a film of a composition comprising a polymeric organo-metal compound; a surface treating agent having a surface energy of 20 to 40 erg/cm$^2$ and comprising as polymerized units one or more monomers comprising a surface treating moiety chosen from protected hydroxyl, protected carboxyl, and mixtures thereof, and a solvent on a surface of the substrate; causing the surface treating agent to migrate to the surface of the film; and curing the film to form an oxymetal hardmask layer having a patterned surface comprising regions of different surface energies.

11. The composition of claim 1 wherein the surface treating polymer comprises pendant groups comprising the surface treating moiety.

12. The composition of claim 1 wherein the surface treating polymer comprises ethylenically unsaturated monomers as polymerized units.

13. The composition of claim 1 wherein the one or more monomers comprising a surface treating moiety are chosen from hydroxystyrenes, (meth)acrylate esters, and silsesquioxanes.

14. The composition of claim 1 wherein the surface treating moiety is chosen from protected hydroxyl, protected carboxyl, and mixtures thereof.

15. The composition of claim 1 wherein the protected hydroxyl is chosen from methoxymethyl ethers, tetrhydropyranyl ethers, tert-butyl ethers, allyl ethers, benzyl ethers, tert-butyldimethylsilyl ethers, tert-butyldiphenylsilyl ethers, acetonides, benzylidene acetals, pivalic acid esters, benzoic acid esters, and tert-butylcarbonate.

16. The composition of claim 1 wherein the surface treating polymer comprises as polymerized units one or more monomers chosen from (meth)acrylate esters, styrene monomers, and hydroxystyrene monomers.

* * * * *